(12) United States Patent
Yamamoto et al.

(10) Patent No.: US 11,782,425 B2
(45) Date of Patent: Oct. 10, 2023

(54) SUBSTRATE PROCESSING APPARATUS, METHOD OF MONITORING ABNORMALITY OF SUBSTRATE PROCESSING APPARATUS, AND RECORDING MEDIUM

(71) Applicant: KOKUSAI ELECTRIC CORPORATION, Tokyo (JP)

(72) Inventors: Kazuyoshi Yamamoto, Toyama (JP);
Kazuhide Asai, Toyama (JP);
Hidemoto Hayashihara, Toyama (JP);
Mitsuru Fukuda, Toyama (JP);
Kayoko Yashiki, Toyama (JP);
Takayuki Kawagishi, Toyama (JP);
Hiroyuki Iwakura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 96 days.

(21) Appl. No.: 16/807,601

(22) Filed: Mar. 3, 2020

(65) Prior Publication Data
US 2020/0201305 A1   Jun. 25, 2020

Related U.S. Application Data

(63) Continuation of application No. PCT/JP2017/031719, filed on Sep. 4, 2017.

(51) Int. Cl.
*G05B 19/418* (2006.01)
(52) U.S. Cl.
CPC ............ *G05B 19/41875* (2013.01); *G05B 2219/32368* (2013.01)
(58) Field of Classification Search
CPC .......... G05B 19/41875; G05B 2219/32368
See application file for complete search history.

(56) References Cited

U.S. PATENT DOCUMENTS

2006/0184264 A1\* 8/2006 Willis ............... G05B 19/4184
700/108
2009/0018692 A1\* 1/2009 Yoneda ............. H01L 21/67769
700/121

(Continued)

FOREIGN PATENT DOCUMENTS

JP   2012-186213 A   9/2012
JP      5855841 B2   2/2015

OTHER PUBLICATIONS

International Search Report and English Translation, PCT/JP2017/031719 dated Oct. 10, 2017, 5 pgs.

(Continued)

*Primary Examiner* — Thomas C Lee
*Assistant Examiner* — Ameir Myers
(74) *Attorney, Agent, or Firm* — Volpe Koenig

(57) ABSTRACT

There is provided a configuration that includes: a main controller configured to, when executing a process recipe including a specific step of executing a sub-recipe, control a process controller to execute the sub-recipe a predetermined number of times to perform a predetermined process to a substrate: and a device management controller configured to collect device data during an execution of the process, recipe and store the device data in a storage part. The device management controller is further configured to: search the storage part; acquire the device data in a designated step among respective steps constituting the sub-recipe for a number of times of execution of the sub-recipe; calculate a first standard deviation of the device data acquired for the number of times of execution; and compare the first standard deviation with a threshold value and generate an alarm when the first standard deviation exceeds the threshold value.

12 Claims, 10 Drawing Sheets

(56) References Cited

U.S. PATENT DOCUMENTS

| | | | | |
|---|---|---|---|---|
| 2009/0276076 A1* | 11/2009 | Takahashi | .......... | G05B 23/0213 |
| | | | | 700/110 |
| 2010/0332014 A1* | 12/2010 | Albarede | .......... | H01J 37/32935 |
| | | | | 700/110 |
| 2011/0040510 A1* | 2/2011 | Nishida | .............. | G01B 11/0633 |
| | | | | 702/82 |
| 2011/0182574 A1* | 7/2011 | Peng | .................... | H04B 10/695 |
| | | | | 398/202 |
| 2012/0226475 A1 | 9/2012 | Asai | | |
| 2012/0253724 A1 | 10/2012 | Asai et al. | | |
| 2014/0039805 A1* | 2/2014 | Sharpe, Jr. | ............ | F04B 49/065 |
| | | | | 73/19.03 |
| 2015/0368794 A1* | 12/2015 | Morita | ................ | C23C 16/4405 |
| | | | | 156/345.24 |
| 2020/0333777 A1* | 10/2020 | Maruyama | ............. | G06N 20/10 |

OTHER PUBLICATIONS

Korean Office Action dated Jun. 9, 2022 for Korean Patent Application No. 10-2022-7013031.

\* cited by examiner $$s = \sqrt{\frac{1}{n}\sum_{i=1}^{n}(y_{max\ i} - \bar{y})^2}$$

$S$ : Standard deviation $n$ : The number of data $y_{max\ i}$ : Value of each data $\bar{y}$ : Average value

SUBSTRATE PROCESSING APPARATUS, METHOD OF MONITORING ABNORMALITY OF SUBSTRATE PROCESSING APPARATUS, AND RECORDING MEDIUM

CROSS-REFERENCE TO RELATED APPLICATION(S)

This application is a Bypass Continuation Application of PCT International Application No. PCT/JP2017/031719, filed on Sep. 4, 2017, the entire contents of which are incorporated herein by reference.

TECHNICAL FIELD

The present disclosure relates to a substrate processing apparatus, a method of monitoring an abnormality of the substrate processing apparatus, and a recording medium. The present disclosure relates to a technique for grasping the operation status of the substrate processing apparatus that processes a substrate for example, a semiconductor manufacturing apparatus that forms a film on a substrate.

BACKGROUND

In the field of semiconductor production, in order to improve the operation rate and production efficiency of an apparatus, information of the apparatus is accumulated and used to analyze abnormalities of the apparatus and monitor the status of the apparatus. For example, SPC (Statistical Process Control) or the like is used on the basis of actual measurement value information reported from a monitoring target to determine whether or not an abnormality has occurred in the apparatus. A related art discloses a method of managing the integrity of data using SPC.

In addition, another related art discloses a technique in which various types of monitor data by a process recipe are stored in a memory and are statistically processed, the average/minimum maximum values are stored in a statistic table, and an abnormality occurrence time is detected from data of film formation temperature for each batch.

A dry vacuum pump used in a semiconductor manufacturing apparatus is a vacuum pump that does not use oil or liquid in a vacuum chamber. This pump has a rotor in a casing and is rotated at the same cycle in opposite directions by a pair of gears. The casing of the rotor transfers and compresses a gas while rotating with a slight gap maintained without contact. When by-products stay between the rotor and the casing, a load is applied due to biting. It is known that this load causes rise of a spike-shaped current in a pump current, which eventually leads to pump stop.

A semiconductor manufacturing apparatus used for a film forming process uses a vacuum pump for exhausting the interior of a reaction tube. For this reason, a spike-shaped current may rise in a pump current during a film-forming step. Therefore, pump stop can be monitored by managing the maximum of current value of the pump as a threshold value.

However, when only the maximum value of the pump current is monitored, regardless of the frequency of spike-shaped current rise, a large load applied even once may be determined as abnormal. Further, it is necessary to adjust the threshold value while looking at the actual pump current value, which may make it difficult to find an optimal value.

The present disclosure provides some embodiments of a technique capable of predicting an abnormal event by monitoring a change in current value of a pump.

SUMMARY

According to one or more embodiments of the present disclosure, there is provided a configuration that includes: a main controller configured to, when executing a process recipe including a specific step of executing a sub-recipe, control a process controller to execute the sub-recipe a predetermined number of times to perform a predetermined process to a substrate; and a device management controller configured to collect device data during an execution of the process recipe and store the device data in a storage part. The device management controller is further configured to: search the storage part in which the device data is stored; acquire the device data in a designated step among respective steps constituting the sub-recipe for a number of times of execution of the sub-recipe; calculate a first standard deviation of the device data acquired for the number of times of execution, and compare the calculated first standard deviation with a threshold value and generate an alarm when the calculated first standard deviation exceeds the threshold value.

Figure 1:
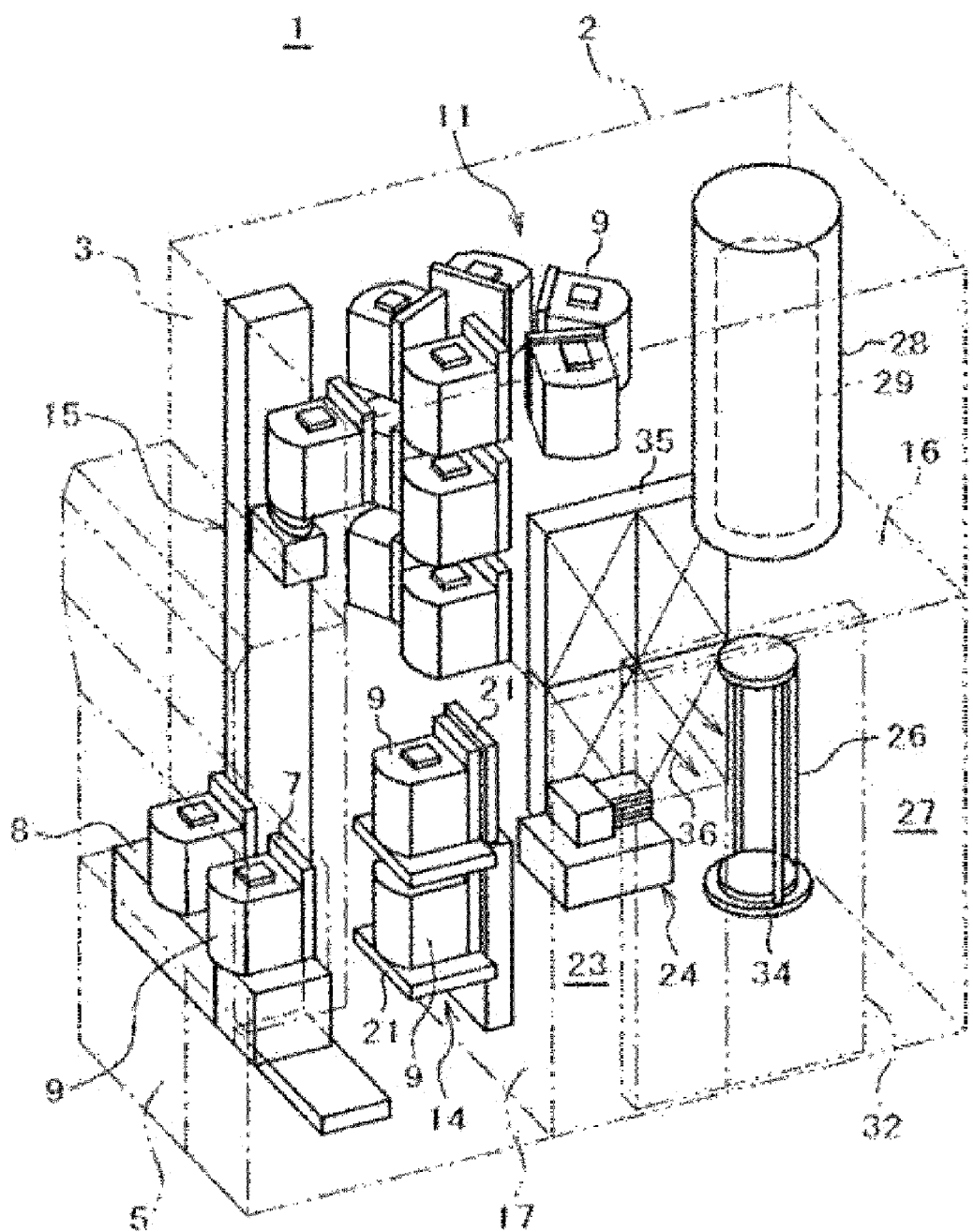
FIG. 1 is a perspective view showing a substrate processing apparatus suitably used in embodiments of the present disclosure.

DETAILED DESCRIPTION (1) Configuration of Substrate Processing Apparatus

Embodiments will now be described with reference to the drawings. However, in the following description, the same components may be denoted by the same reference numerals, and explanation thereof may not be repeated. In order to clarify the description, the drawings may be schematically expressed with respect to the width, thickness, shape, and the like of each part as compared to die actual aspects. However, these schematic expressions are merely examples and are not intended to limit the interpretation of the present disclosure.

(Outline of Substrate Processing Apparatus)

Figure 2:
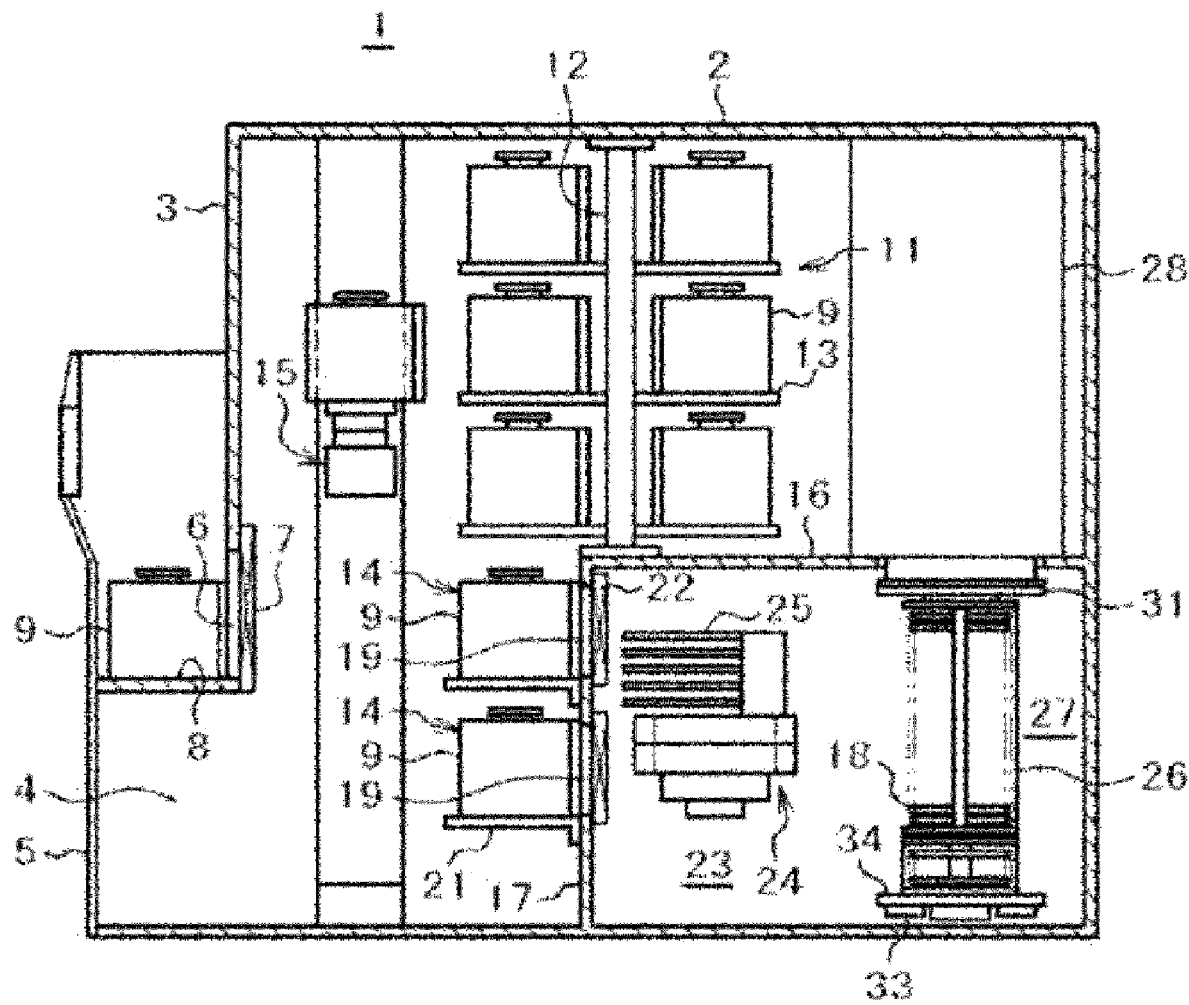
FIG. 2 is a side sectional view showing a substrate processing apparatus suitably used in embodiments of the present disclosure.

Hereinafter, embodiments of the present disclosure will be described with reference to the drawings. First, a substrate processing apparatus (hereinafter also simply referred to as an apparatus) 1 in which the present disclosure is practiced will be described with reference to FIGS. 1 and 2.

The substrate processing apparatus 1 includes a housing 2. An opening (front maintenance port) 4 provided for maintenance is formed at a lower portion of a front wall 3 of the housing 2 and is opened and closed by a front maintenance door 5.

A pod-loading/unloading port 6 is formed on the front wall 3 of the housing 2 so as to communicate with the inside and outside of the housing 2, and is opened and closed by a front shutter 7. A load port 8 is installed on the front side of the pod-loading/unloading port 6 and is configured to align a placed pod 9. The pod 9, which is an air-tightly sealed substrate transfer container, is loaded onto the load port 8 by an in-process transfer device (not shown) and unloaded from the load port 8.

A rotary pod shelf 11 is installed at an upper portion of the housing 2 at substantially a central portion in the front-rear direction. The rotary pod shelf 11 is configured to store a plurality of pods 9. The rotary pod shelf 11 includes a post 12 that is vertically set up and intermittently rotated, and a plurality of shelf plates 13 that are radially supported by the post 12 at respective positions of the upper, middle and lower stages. The shelf plates 13 are configured to store a plurality of pods 9 mounted thereon. A pod opener 14 is provided below the rotary pod shelf 11. The pod opener 14 has a configuration in which a pod 9 is placed and a lid of the pod 9 can be opened and closed.

A pod transfer mechanism 15 is installed between the load port 8, the rotary pod shelf 11, and the pod opener 14. The pod transfer mechanism 15 can move up and down while holding the pod 9 and can move back and forth in the horizontal direction. Accordingly, the pod transfer mechanism 15 can transfer the pod 9 between the load port 8, the rotary pod shelf 11, and the pod opener 14.

A sub-housing 16 is provided over the rear end of the lower portion of the housing 2 at substantially the central portion in the front-rear direction. A pair of wafer-loading/unloading ports 19 for loading/unloading a wafer (hereinafter also referred to as a substrate) 18 into/from the sub-housing 16 is arranged on the front wall 17 of the sub-housing 16 in two upper and lower stages in a vertical direction. The pod opener 14 is provided for each of the upper and lower wafer-loading unloading ports 19.

The pod opener 14 includes a mounting table 21 on which a pod 9 is mounted, and an opening/closing mechanism 22 that opens and closes the lid of the pod 9. The pod opener 14 is configured to open and close the wafer entrance of the pod 9 by opening and closing the lid of the pod 9 mounted on the mounting table 21 by the opening, closing mechanism 22.

The sub-housing 16 constitutes a transfer chamber 23 that is airtight from a space (pod transfer space) in which the pod transfer mechanism 15 and the rotary pod shelf 11 are disposed. A wafer transfer mechanism (substrate transfer mechanism) 24 is installed at the from region of the transfer chamber 23. The substrate transfer mechanism 24 includes the predetermined number of wafer-mounting plates 25 (five in the figure) on which the substrates 18 are mounted. The wafer-mounting plates 25 can linearly move in the horizontal direction, rotate in the horizontal direction, and move up and down. The substrate transfer mechanism 24 is configured to load/unload the substrates 18 into/from a boat (substrate holder) 26.

A standby part 27 for accommodating end wailing the boat 26 is formed at the rear region of the transfer chamber 23, and a vertical process furnace 28 is provided above the standby part 27. The process furnace 28 has a process chamber (reaction chamber) 29 formed therein, the lower end portion of the process chamber 29 serves as a furnace port, and the furnace port is opened and closed by a furnace port shutter 31.

A boat elevator 32 serving as an elevation mechanism for moving up and down the boat 26 is installed between the right end of the housing 2 and the right end of the standby part 27 of the sub-housing 16. A seal cap 34 serving as a lid is horizontally attached to an arm 33 connected to a lifting platform of the boat elevator 32. The lid 34 vertically supports the boat 26, and can air-tightly close the furnace port in a state where the boat 26 is loaded in the process chamber 29.

The boat 26 is configured to hold a plurality of substrates 18 (for example, about 50 to 125 substrates) in multiple stages in a horizontal posture with the centers thereof aligned.

A clean unit 35 is disposed at a position opposite to the boat elevator 32 side. The clean unit 35 includes a supply fan and a dustproof filter so as to supply clean air 36 which is a cleaned atmosphere or an inert gas. A notch-aligning device (not shown) serving as a substrate-aligning device for aligning the circumferential position of the substrates 18 is installed between the substrate transfer mechanism 24 and the clean unit 35.

The clean air 36 blown out from the clean unit 35 is circulated through the notch-aligning device (not shown), the substrate transfer mechanism 24, and the boat 26, and is then sucked through a duct (not shown) and exhausted outside the housing 2 or is blown out into the transfer chamber 23 by the clean unit 35.

Next, the operation of the substrate processing apparatus 1 will be described. When the pod 9 is supplied to the load port 8, live pod-loading, unloading port 6 is opened by the front shutter 7. The pod 9 on the load port 8 is loaded into the housing 2 through the pod-loading/unloading port 6 by the pod transfer mechanism 15 and is mounted on a designated shelf plate 13 of the rotary pod shelf 11. After the pod 9 is temporarily stored in the rotary pod shelf 11, the pod 9 is transferred from the shelf plate 13 to one of the pod openers 14 by the pod transfer mechanism 15 and is then transferred to the mounting table 21, or is directly transferred from the load port 8 to the mounting table 21.

At this time, the wafer-loading unloading port 19 is closed by the opening/closing mechanism 22, and the transfer chamber 23 is filled with the circulated clean air 36. Since the transfer chamber 23 is filled with a nitrogen gas as the clean air 36, the oxygen concentration in the transfer chamber 23 is lower than the internal oxygen concentration of the housing 2.

The opening side end face of the pod 9 mounted on the mounting table 21 is pressed against the opening edge of the wafer-loading-unloading port 19 in the front wall 17 of the sub-housing 16, and the lid of the pod 9 is removed by the opening/closing mechanism 22 to open the wafer entrance.

When the pod 9 is opened by the pod opener 14, the substrate 18 is taken out of the pod 9 by the substrate transfer mechanism 24, transferred to tire notch-aligning device (not shown), and aligned in the notch-aligning device. After that, the substrate transfer mechanism 24 loads the substrate 18 into the standby part 27 at the rear of the transfer chamber 23 and charges the substrate 18 in the boat 26.

The substrate transfer mechanism 24 that delivered the substrate 18 to the boat 26 returns to the pod 9 and charges the next substrate 18 into the boat 26. During the charging operation of the substrate 18 in the boat 26 by the substrate transfer mechanism 24 in one (upper or lower) pod opener 14, another pod 9 is transferred from the rotary pod shelf 11 to the other (lower or upper) pod opener 14 by the pod transfer mechanism 15, and the opening operation of the pod 9 by the other pod opener 14 is simultaneously performed.

When a predetermined number of substrates 18 are charged in the boat 26, the furnace port of the process furnace 28 that has been closed by die furnace port shutter 31 is opened by the furnace port shutter 31. Subsequently, the boat 26 is moved up by the boat elevator 32 and loaded into the process chamber 29.

After the loading, the furnace port is air-tightly closed by tire seal cap 34. In the present embodiments, at this timing (after the loading), a purge process (pre-purge process) in which the process chamber 29 is replaced with an inert gas is performed.

The process chamber 29 is vacuum-exhausted by a gas exhaust mechanism (not shown) such as a vacuum pump so that the process chamber 29 has a desired pressure (degree of vacuum). Further, the process chamber 29 is heated to a predetermined temperature by a heater driving part (not shown) so that the process chamber 29 has a desired temperature distribution. Further, a processing gas controlled to a predetermined flow rate is supplied by a gas supply mechanism (not shown). As the processing gas is brought into contact with the surface of the substrate 18 in the course of flowing through the process chamber 29, a predetermined process is performed on the surface of the substrate 18. Further, the processing gas after reaction is exhausted from the process chamber 29 by the gas exhaust mechanism.

When a preset processing time has elapsed, an inert gas is supplied from an inert gas supply source (not shown) by the gas supply mechanism, the process chamber 29 is replaced with the inert gas, and the internal pressure of the process chamber 29 is returned to the normal pressure (after-purge process). Then, the boat 26 is moved down by the boat elevator 32 through the seal cap 34.

Regarding unloading of the processed substrate 18, the substrate 18 and the pod 9 are discharged to the outside of the housing 2 in the reverse order of the above description. An unprocessed substrate 18 is further charged in the boat 26, and the processing of the substrate 18 is repeated.

(Functional Configuration of Control System 200)

Figure 3:
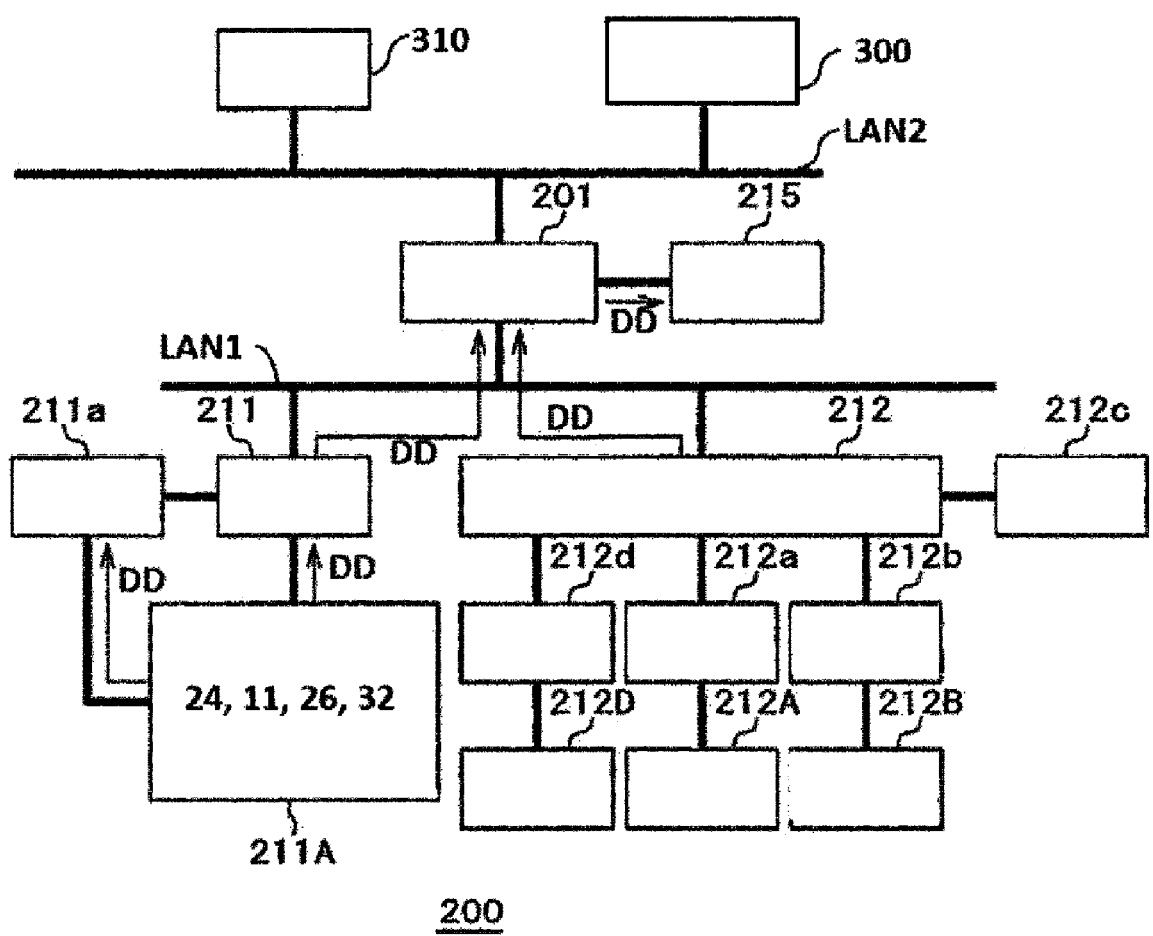
FIG. 3 is a view showing the functional configuration of a control system suitably used in embodiments of the present disclosure.

Next, the functional configuration of the control system 200 centering on a main controller 201 as an operation part will be described with reference to FIG. 3. As shown in FIG. 3, the control system 200 includes a main controller 201, a transfer system controller 211 as a transfer controller, a process system controller 212 as a process controller, and a device management controller 215 as a data monitoring part. The device management controller 215 functions as a data collection controller to collect device data in the inside and outside of the apparatus 1, and monitor the integrity of the device data DD in the apparatus 1. In the present embodiments, the control system 200 is accommodated in the apparatus 1.

Here, the device data DD refers to data generated by operating each component when the substrate processing apparatus 1 processes the substrate 18, such as data related to substrate processing (hereinafter also referred to as control parameters) such as a processing temperature, a processing pressure, a flow rate of a processing gas, or the like when the apparatus 1 processes the substrate 18, data reined to the quality (for example, a thickness of a formed film, a cumulative value of the film thickness, etc.) of manufactured product substrates, data (for example, a set value, a measured value, etc.) related to the components (quartz reaction tube, heater, valve, MFC, etc.) of the apparatus 1, and the like.

Note that data collected during recipe execution may be referred to as process data. For example, the process data such as raw waveform data as specific interval (for example, 1 second) data from the start to the end of the recipe, statistics data of each step in the recipe, etc. are also included in the device data DD. A maximum value, a minimum value, an average value, and the like are included in the statistics data. Event data indicating various apparatus events (for example, data indicating maintenance history) when the recipe is not executed (for example, at idling when the substrate is not loaded into the apparatus) are also included in the device data DD.

Since the main controller 201 is electrically connected to the transfer system controller 211 and the process system controller 212 via a LAN line LAN1 such as 100BASE-T, the main controller 201 is capable of transmission-reception of each device data DD, downloading and uploading of each file, etc.

The operation part 201 is provided with a port as a mounting part into which a recording medium (for example, a USB key or the like) as an external storage device is detachably inserted. An OS corresponding to this port is installed in the operation part 201. Further, an external upper level computer 300 and a management apparatus 310 are connected to the operation part 201 via a communication network LAN2 such as 100BASE-T. For this reason, even when the substrate processing apparatus 1 is installed in a clean room, the external upper level computer 300 and the management apparatus 310 can be arranged in an office outside the clean room.

The device management controller 215 is connected to the operation part 201 via a LAN line and is configured to collect the device data DD from the operation part 201, quantify the operation status of die apparatus, and display it on a screen. The device management controller 215 will be described in detail below.

The transfer system controller 211 is connected to a substrate transfer system 211A mainly including the rotary pod shelf 11, the bout elevator 32, the pod transfer mechanism 15, the substrate transfer mechanism 24, the boat 26, and a rotation mechanism (not shown). The transfer system controller 211 is configured to control the transfer operations of the rotary pod shelf 11, the boat elevator 32, the pod transfer mechanism 15, the substrate transfer mechanism 24, the boat 26, and the rotation mechanism (not shown). In particular, the transfer system controller 211 is configured to control the transfer operations of the boat elevator 32, the pod transfer mechanism 15, and the substrate transfer mechanism 24 through a motion controller 211*a*.

The process system controller 212 includes a temperature controller 212*a*, a pressure controller 212*b*, a gas flow rate controller 212*c*, and a sequencer 212*d*. These temperature controller 212*a*, pressure controller 212*b*, gas flow rate controller 212*c*, and sequencer 212*d* constitute sub-controllers and are electrically connected to the process system controller 212. Therefore, these sub-controllers are capable of transmission/reception of each device data DD, downloading and uploading of each file, etc. The process system controller 212 and the sub-controllers are illustrated as separate bodies, but may be integrated.

A healing mechanism 212A is connected to the temperature controller 212*a* mainly including a heater, a temperature sensor, and the like. The temperature controller 212*a* is configured to adjust the internal temperature of the process furnace 28 by controlling the temperature of the heater of the process furnace 28. The temperature controller 212*a* is further configured to control power to be supplied to a heater wire by performing switching (on/off) control of a thyristor.

A gas exhaust mechanism 212B mainly including a pressure sensor, an ARC valve, which is a pressure valve, and a vacuum pump, is connected to the pressure controller 212*b*. The pressure controller 212*b* is configured to control the degree of opening of the APC valve and switching (on/off) of the vacuum pump based on a pressure value detected by the pressure sensor so that the internal pressure of the process chamber 29 readies a desired pressure at a desired timing.

The gas flow rate controller 212*c* includes an MFC. The sequencer 212*d* is configured to control the supply and stop of a gas from a processing gas supply pipe or a purge gas supply pipe by opening closing a valve 212D. Further, the process system controller 212 is configured to control the MFC 212*c* and the valve 212D so that the flow rate of a gas to be supplied into the process chamber 29 reaches a desired flow rate at a desired timing.

Note that the main controller 201, the transfer system controller 211, the process system controller 212, and the device management controller 215 according to the present embodiments can be realized using a normal computer system without resort to a dedicated system. For example, each controller that executes a predetermined process can be configured by installing in a general-purpose computer a program for executing the above-described process from a recording medium (such as a USB key) that stores the program.

A means for supplying this program is optional. In addition to being able to be supplied through a predetermined recording medium as described above, it may be supplied through, for example, a communication line, a communication network, a communication system, or the like. In this case, for example, the program may be posted on a bulletin board of a communication network, and the program may be provided by being superimposed on a carrier wave via the network. A predetermined process can be executed by starting the program thus provided and executing it in the same manner as other application programs under control of the OS.

(Configuration of Main Controller 201)

Figure 4:
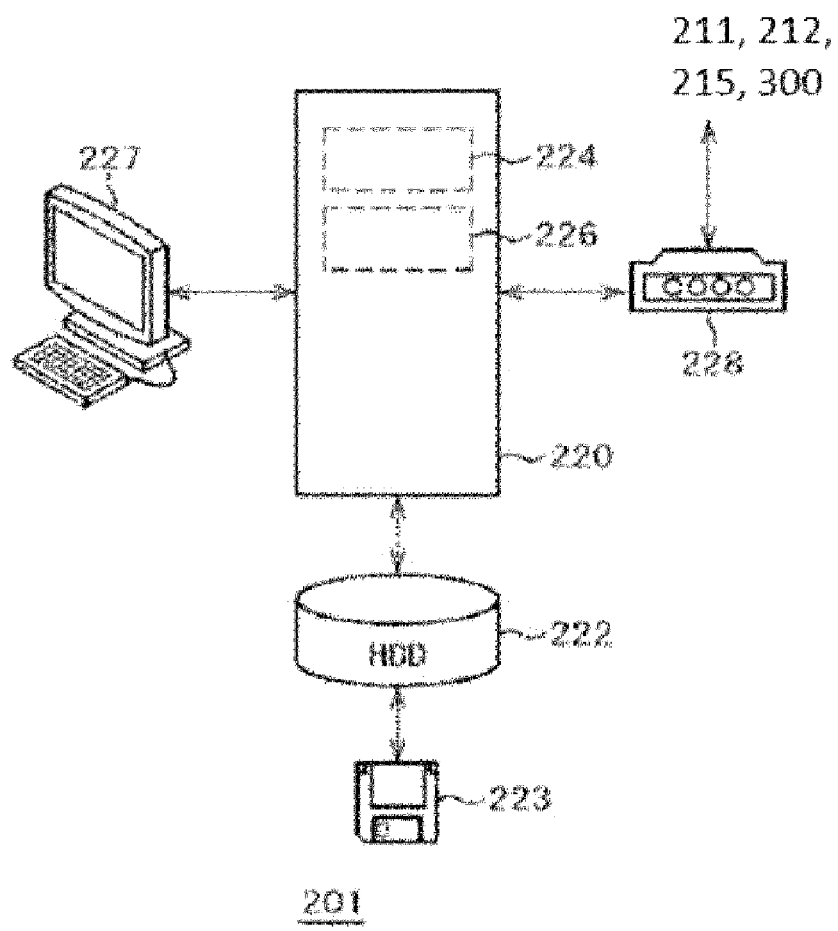
FIG. 4 is a view showing the functional configuration of a main controller suitably used in embodiments of the present disclosure.

Next, the configuration of the main controller 201 will be described with reference to FIG. 4. The main controller 201 is configured to include a main controller control part 220, a hard disk 222 as a main controller storage part, an operation display part 227 including a display part that displays various types of information and an input part that receives various instructions from an operator, and a transmission/reception module 228 as a main controller communication part that communicates with the inside and outside of the apparatus 1. The main controller control part 220 is configured as a computer that includes a CPU (Central Processing Unit) 224 as a processing part, and a memory (RAM, ROM, etc.) 226 as a temporary storage part and has a clock function (not shown).

The hard disk 222 stores recipe files such as recipes in which substrate-processing conditions and processing procedures are defined, a control program file for executing these recipe files, a parameter file in which parameters for executing the recipes are defined, an error-processing program file, an error processing parameter file, various screen files including an input screen for inputting process parameters, various icon files, and the like (none of which are shown).

Further, each operation button as an input part for inputting operation instructions to the substrate transfer system 211A and tire substrate processing system (the heating mechanism 212A, the gas exhaust mechanism 212B, and the gas supply system 212C) shown in FIG. 3 may be provided on the operation screen of the operation display pan 227.

The operation display part 227 is configured to display an operation screen for operating the apparatus 1. The operation display part 227 displays information, based on the device data DD generated in the substrate processing apparatus 100 through the operation screen, on the operation screen. The operation screen of the operation display part 227 is, for example, a touch panel using liquid crystal. The operation display pan 227 receives operator input data (input instruction) from the operation screen and transmits the operator input data to the main controller 201. In addition, the operation display pan 227 receives an instruction (control instruction) for executing a recipe deployed on the memory (RAM) 226 or the like or any substrate-processing recipe (hereinafter also referred to as a process recipe) among a plurality of recipes stored in the main controller storage part 222, and transmits the control instruction to the main controller control part 220.

In these embodiments, when tire device management controller 215 starts up, it deploys each stored screen file and data table by executing various programs and the like, and displays each screen showing the operation status of the apparatus on the operation display part 227 by reading the device data DD.

A switching hub or the like is connected to the main controller communication part 228, and the main controller 201 transmits receives data to/from the external upper level computer 300, the other controllers 211, 212, and 215 in the apparatus 1, and the like via a network.

In addition, the main controller 201 transmits the device data DD such as the status of the apparatus 1 to the external upper level computer 300, for example, a host computer, via a network (not shown). Further, the substrate-processing operation of the apparatus 1 is controlled by the control system 200 based on each recipe file, each parameter file, and the like stored in the main controller storage part 222.

(Substrate-Processing Method)

Next, a substrate-processing method having a predetermined processing process performed using the apparatus 1 according to the present embodiments will be described. Here, an example of the predetermined processing process is described with a case of performing a substrate processing process (here, film forming process) which is a process of manufacturing a semiconductor device. In performing the substrate processing process, a substrate-processing recipe (process recipe) corresponding to substrate processing to be performed is deployed on a memory such as a RAM in the process system controller 212. Then, if necessary, an operation instruction is given from the main controller 201 to the process system controller 212 or the transfer system controller 211. The substrate processing process performed in this manner includes at least a loading step, a film-forming step and an unloading step.

(Transferring Step)

The main controller 201 issues an instruction to drive the substrate transfer mechanism 24 to the transfer system controller 211. Then, according to an instruction from the transfer system controller 211, the substrate transfer mechanism 24 starts a step of transferring a substrate 18 from a pod 9 on a transfer stage 21 as a mounting table to the boat 26. This transferring step is performed until the charging of all the scheduled substrates 18 in the boat 26 (wafer charging) is completed.

(Loading Step)

When a predetermined number of substrates 18 are charged in the boat 26, the boat 26 is moved up by the boat elevator 32 that operates according to an instruction from the transfer system controller 211, and is loaded into the process chamber 29 formed in the process furnace 28 (boat loading). When the boat 26 is completely loaded, the seal cap 34 of the boat elevator 32 air-tightly closes the lower end of a manifold of the process furnace 28.

(Film-Forming Step)

Next, according to an instruction from the pressure controller 212b, the interior of the process chamber 29 is vacuum-exhausted by the vacuum exhaust device such as a vacuum pump so that the internal pressure of the process chamber 29 reaches a predetermined film-forming pressure (degree of vacuum). Further, according to an instruction from the temperature controller 212a, the interior of the process chamber 29 is heated by the heater so that the internal temperature of the process chamber 29 readies a predetermined temperature. Subsequently, according to an instruction from the transfer system controller 211, rotation of the boat 26 and the substrate 18 by the rotation mechanism is started. Then, in a state where the interior of the process chamber 29 is maintained at the predetermined pressure and the predetermined temperature, a predetermined gas (processing gas) is supplied to a plurality of substrates 18 held in the boat 26 to perform a predetermined process (for example, a film forming process) to the substrates 18. In some cases, the internal temperature may be lowered from the processing temperature (the predetermined temperature) before the next unloading step.

(Unloading Step)

When the film-forming step for the substrates 18 placed on the boat 26 is completed, according to an instruction from the transfer system controller 211, the rotation of the boat 26 and the substrates 18 by the rotation mechanism is stopped, the seal cap 34 is lowered by the boat elevator 32 to open the lower end of the manifold, and the boat 26 holding the processed substrates 18 is unloaded from the process furnace 28 (boat unloading).

(Recovering Step)

Then, the boat 26 holding the processed substrates 18 is very effectively cooled by the clean air 36 blown out from the clean unit 35. Then, when the boat 26 is cooled to, e.g., 150 degrees C. or lower, the processed substrates 18 are removed from the boat 26 (wafer discharging) and are transferred to the pod 9, and then new unprocessed substrates 18 are transferred to the boat 26.

(Functional Configuration of Device Management Controller 215)

Figure 5:
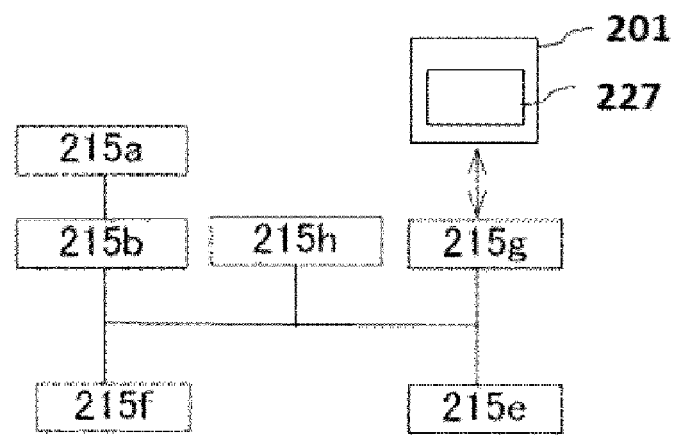
FIG. 5 is a view for explaining the functional configuration of a device management controller suitably used in embodiments of the present disclosure.

Next, as shown in FIG. 5, the device management controller 215 includes a screen display part 215a, a screen display controller 215b, an apparatus status monitoring part 215e, an abnormality analysis support part 215f, a communication part 215g that transmits/receives the device data DD of the substrate processing apparatus 1 to/from the main controller 201, and a storage part 215h that stores various types of data.

(Screen Display Part 215a)

The screen display part 215a is configured to display the function of the device management controller 215. Further, instead of the screen display pan 215a, the operation display pan 227 of the main controller 201 may be used for display. Alternatively, an operation terminal or the like may be used instead of the screen display pan 215a.

(Screen Display Controller 215b)

The screen display controller 215b controls to execute a screen display program to process the collected device data DD into data for screen display to create and update screen display data, and to display the updated screen display data on the screen display part 215a or the operation display pan 227. In the present embodiments, the updated screen display data are displayed on not the screen display part 215a but the operation display part 227.

(Apparatus Status Monitoring Part 215e)

Figure 6:
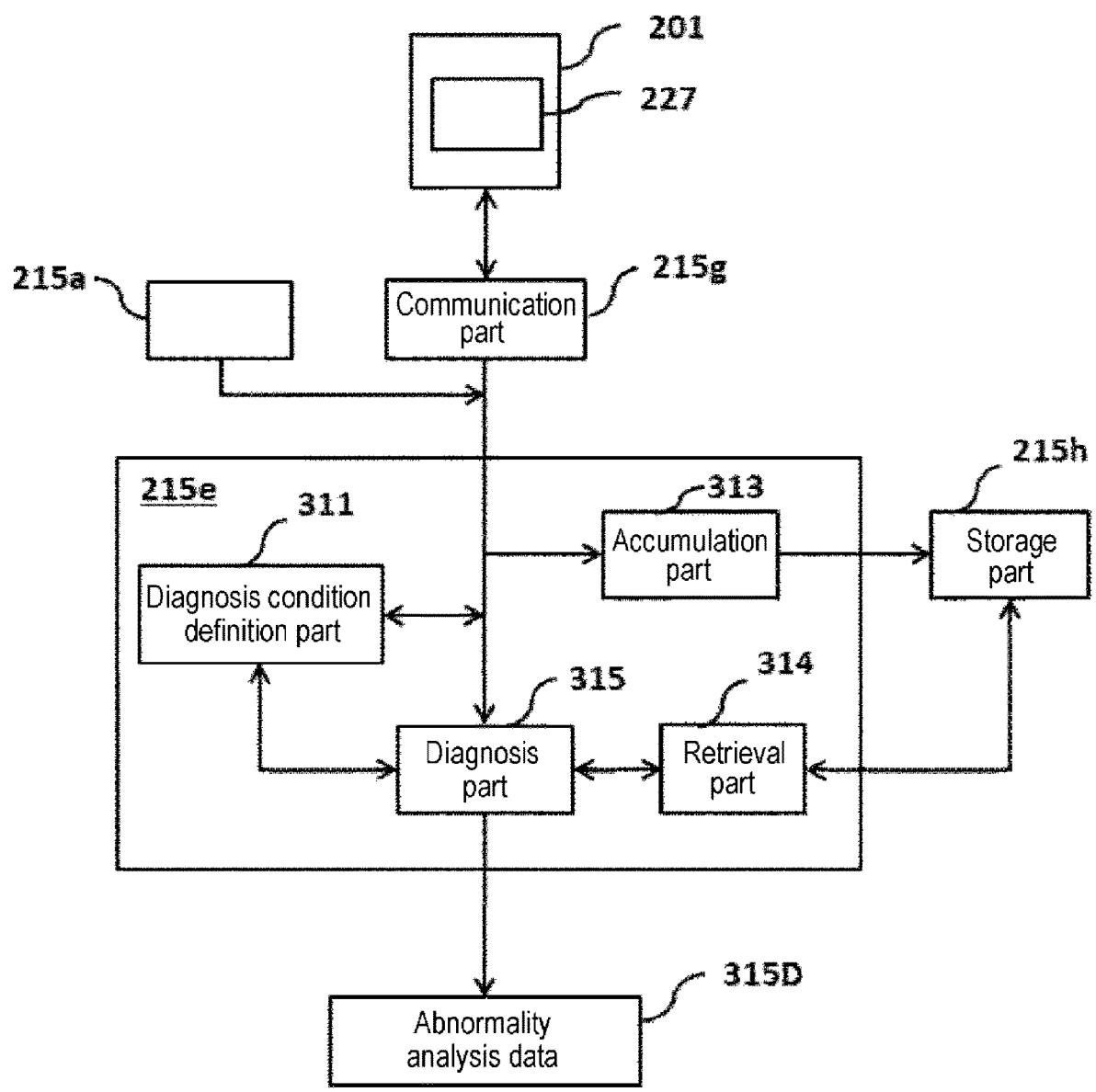
FIG. 6 is a view for explaining the functional configuration of an apparatus status monitoring part suitably used in embodiments of the present disclosure.

The apparatus status monitoring part 215e has apparatus-status-monitoring programs in a memory (for example, the storage part 215h), and executes an apparatus status monitoring function. As shown in FIG. 6, the apparatus status monitoring part 215e includes a diagnosis condition definition part 311, an accumulation part 313, a retrieval part 314, and a diagnosis pan 315. A pump-current-abnormality-monitoring program in the present embodiments, which is one of the apparatus-status-monitoring programs and is executed by the apparatus status monitoring part 215e, will be described below.

For example, device data DD of a monitoring target or a diagnosis target designated by input (such as operation command input) from the screen display part 215a or the operation display pan 227, an abnormality diagnosis rule such as an upper limit designated value (UCL) and a lower limit designated value related to the device data DD, and the like are set as monitoring contents or diagnosis condition definition data in the diagnosis condition definition part 311.

The accumulation part 313 performs control to accumulate all device data DD supplied from the operation part 201 via the communication part 215g in the storage part 215h. In addition, the accumulation part 313 performs control to accumulate primary statistics data generated by the diagnosis part 315 in the storage part 215h. Further, the accumulation pan 313 holds the maximum value of the device data DD, the minimum value of the device data DD, and the integrated value of the device data DD on a memory that is cleared at the sum of a step, and updates the maximum value, the minimum value, and the integrated value every time the device data DD is received. In response to a step end event, an average value obtained by dividing the calculated maximum value/minimum value-integrated value of the primary statistics data by the elapsed lime is stored in a statistics data storage area of the storage part 215h via the accumulation part 313.

The retrieval part 314 performs control to retrieve the device data DD of the diagnosis target among various device data DD stored in the storage part 215h based on an instruction from the diagnosis part 315 and supply the retrieved device data DD to the diagnosis part 315. In addition, the retrieval part 314 performs control to retrieve the primary statistics data of the device data DD of the diagnosis target based on an instruction from the diagnosis part 315 and supply the retrieved primary statistics data to the diagnosis pan 315.

The diagnosis part 315 performs abnormality determination, generation of diagnosis results, and the like. The diagnosis part 315 starts diagnosis as a diagnosis start timing is notified from an event monitor included in the communication part 215g. For example, the event monitor included in the communication part 215g notifies the diagnosis start timing in response to reception of a process recipe end event.

The diagnosis part 315 searches the statistics data storage area of the storage part 215h by instructing the retrieval part 314 to retrieve the primary statistics data designated by the diagnosis condition definition data when performing the abnormality determination. Plural desired primary statistics data are acquired from the statistics data storage area by an acquisition section of the diagnosis part 315. A calculation section of the diagnosis part 315 calculates the value of the standard deviation S of the acquired plural primary statistics data (maximum value) (hereinafter also referred to as the first standard deviation) as secondary statistics data. A comparison section of the diagnosis part 315 compares the abnormality diagnosis rule designated by the diagnosis condition definition data with the calculated secondary statistics data (the first standard deviation). The abnormality diagnosis rule can be, for example, tire upper limit value (UCL) of the standard deviation S of the maximum value of die device data DD.

As a result of the comparison, when it is determined that the device data DD is abnormal, for example, the diagnosis part 315 generates a diagnosis result showing to the operation display part 227 that the abnormality has been detected, creates abnormality analysis data 315D, and stores it in such a manner that it can be referred from the abnormality analysis support part 215f. The abnormality analysis data 315D can be stored in the storage part 215h, for example.

That is, the accumulation part 313 generates the primary statistics data (for example, including the temporal waveform of the temperature of the process chamber (reaction chamber) 29, processing time, maximum value, minimum value, etc.) based on the device data DD set by the diagnosis condition definition part 311, and the diagnosis part 315 calculates the secondary statistics data (first standard deviation) from the primary statistics data and uses the calculated secondary statistics data to monitor and diagnose the device data DD of the substrate processing apparatus 1. That is, the diagnosis part 315 compares the secondary statistics data of the device data DD transferred from the substrate processing apparatus 1 every moment with the abnormality diagnosis rule, and determines that the device data DD is abnormal if the secondary statistics data of the device data DD deviates from a predetermined range (the abnormality diagnosis rule). Further, the diagnosis part 315 performs diagnosis of the device data DD or the statistics data using a predetermined abnormality diagnosis rule. Further, when is diagnosed that the device data DD or the statistics data is abnormal, for example, the fact that the abnormality has been detected is showed to the operation display part 227.

The apparatus status monitoring pan 215e is configured to store the start/end information of various recipes including the process recipe and the start/end of steps constituting the recipes in the storage pan 215h, as production history information for each batch process.

The apparatus status monitoring part 215e in the present embodiments is further configured to accumulate in the storage pan 215h the event data including maintenance information while the process recipe is not being executed. According to this configuration, since the relation between the statistics of the device data DD and the maintenance work can be displayed on the operation display part 227 or the like, an event that cannot be expressed by a numerical value (for example, event data related to an event such as maintenance) can be displayed, which makes it possible to efficiently check the factor of fluctuation of the process data.

(Abnormality Analysis Support Part 215f)

The abnormality analysis support part 215f is configured to execute a data analysis program, and when an abnormal event (for example, an abnormality in the thickness of a substrate which is a product) occurs, to display on the operation display part 227 the abnormality analysis data for a maintenance worker to analyze the factor of the abnormal event. This contributes to shortening analysis lime and reducing analysis errors due to variations in the skills of maintenance workers.

In this way, the device management controller 215 can be connected to the main controller 201 via a LAN line, collect the device data DD from the main controller 201, process and graph the accumulated device data DD, and display the graphed device data DD on the operation display part 227. Further, the device management controller 215 has an apparatus status monitoring function and is configured to display the operation status of the apparatus on the operation display pan 227 using the device data DD collected from the inside and outside of the substrate processing apparatus 1.

The hardware configuration of the device management controller 215 is the same as that of the main controller 201 described above. In addition, the device management controller 215 can be realized by using a normal computer system without resort to a dedicated system, like the main controller 201. Further, like the main controller 201, a means for supplying various programs is optional.

(Storage Part 215h)

The storage part 215h stores all device data DD from the operation part 201 while the process recipe is being executed, and also stores device data DD such as event data while the process recipe is not being executed, functioning as a database of the apparatus 1. In addition, various programs to be executed by the device management controller 215 are stored in die storage pan 215h, and for example, an apparatus-status-monitoring program and a data analysis program are executed when the device management controller 215 starts up. Further, a pump-current-abnormality-monitoring program and primary statistics data in Examples to be described below are also stored in the storage part 215h. The monitoring contents or diagnosis condition definition data used for the program may also be stored in the storage part 215h.

EXAMPLES

Figure 7:
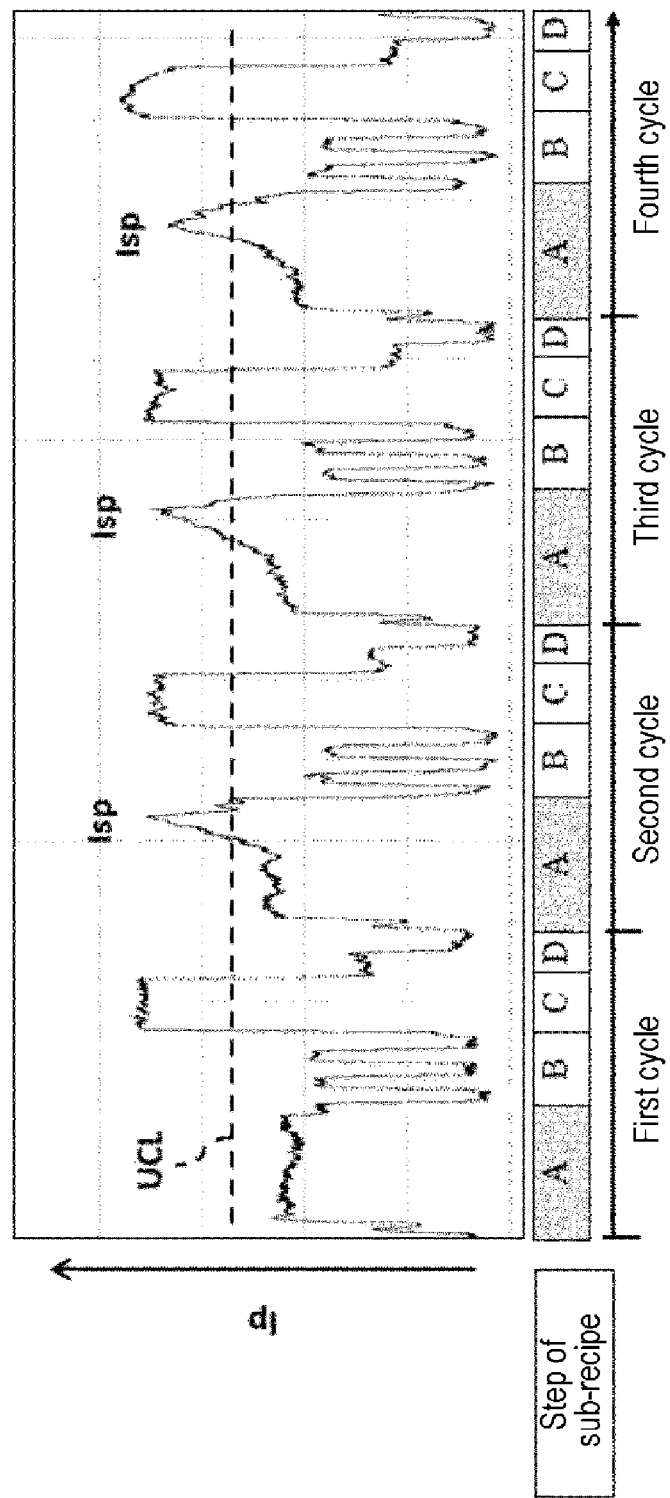
FIG. 7 is a view conceptually showing a relationship between a current value of a vacuum pump and a sub-recipe.

Hereinafter, Examples of the present disclosure will be described with reference to the drawings. FIG. 7 is a view conceptually showing the relationship between a current value of a vacuum pump and a sub-recipe. The vacuum pump is provided in the gas exhaust mechanism 212B. The current value Ip of the vacuum pump can be measured, for example, by installing an AC current sensor to a power cable or power wiring that supplies power to the vacuum pump.

The current value of the vacuum pump is, for example, the consumption current or drive current of the vacuum pump.

The sub-recipe shown in FIG. 7 is executed at a specific step in the process recipe. For example, in these embodiments, steps in a film forming process of the process recipe are shown in FIG. 7. For example, the film forming process may include four steps: a step of supplying a precursor gas into the process chamber 29 (step A), a first purge step of purging the precursor gas from the process chamber 29 (step B), a step of supplying a reaction gas into the process chamber 29 (step C), and a second purge step of purging the reaction gas from the process chamber 29 (step D). Further, in the film forming process, a desired film is formed on a wafer 18 by executing a cycle including steps A to D plural times. FIG. 7 illustrates a case where the film forming process is four cycles.

FIG. 7 shows the relationship between a change in the current value Ip of the vacuum pump and a four-cycle film forming process. The current value Ip of the vacuum pump shows a state where a spike-shaped current rises (Isp) in step A of each of the second, third and fourth cycles. For example, when the upper limit value (UCL) as a threshold value for determining a failure of the vacuum pump is set as indicated by a dotted line, regardless of the frequency of spike-shaped current rise, a large load (step A of the first cycle) applied even once will be determined as abnormal.

The spike-shaped current rise (Isp) is on abnormal phenomenon of the vacuum pump, which is called foreign matter biting abnormality. As described above, when by-products stay between the rotor of the vacuum pump and the casing of the vacuum pump, the foreign matter biting abnormality occurs due to a load applied by biting. The occurrence of the foreign matter biting abnormality appeals as the spike-shaped current use (Isp) in the current value Ip of the vacuum pump.

Figure 8:
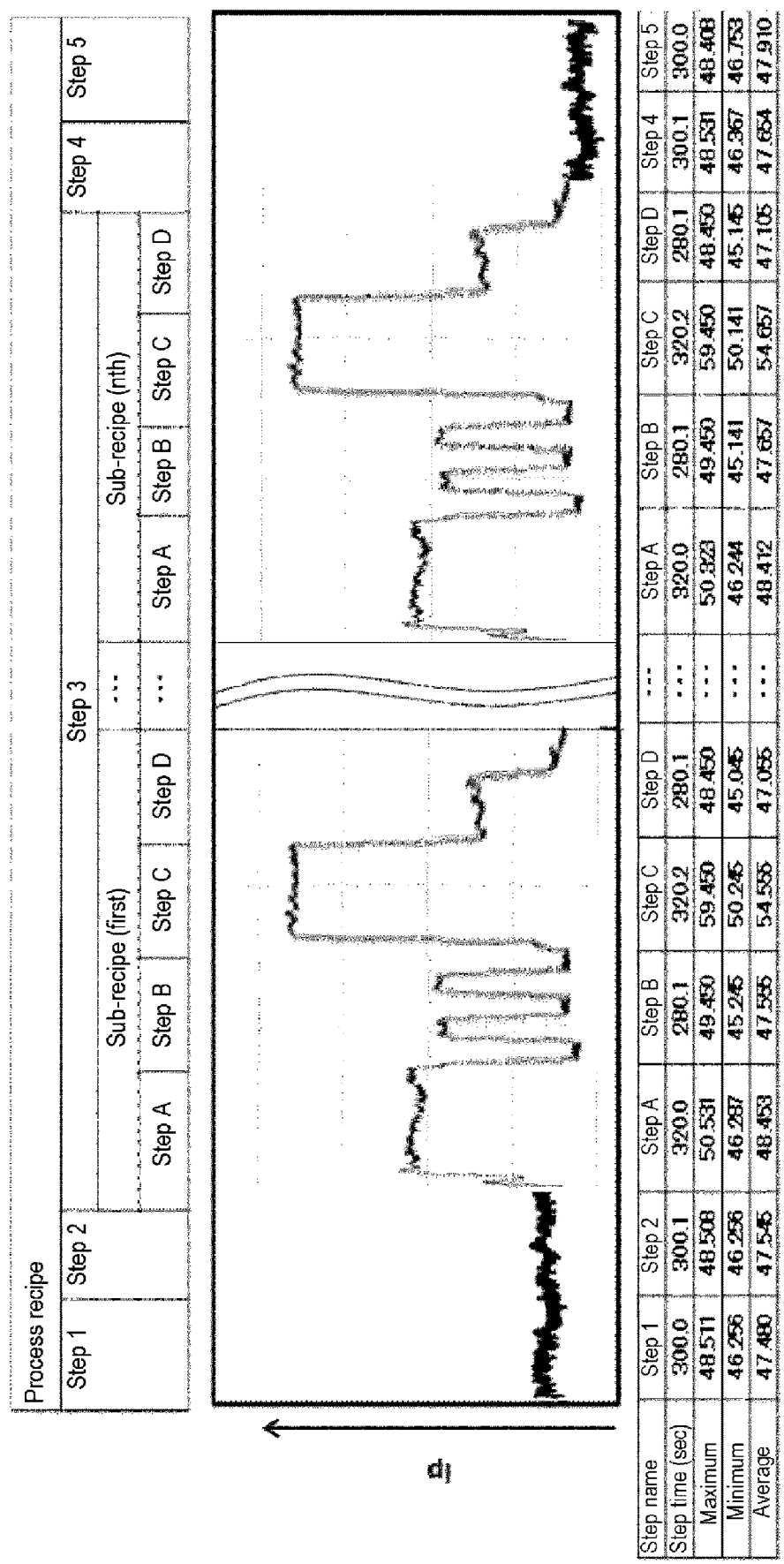
FIG. 8 is a view for explaining primary statistics data of device data in an apparatus status monitoring part according to an Example.

FIG. 8 is a view for explaining statistics data of device data in the apparatus status monitoring part according to an Example. The apparatus status monitoring part 215e stores the device data DD from the start to the end of the process recipe at a specific interval by executing an apparatus-status-monitoring program, calculates the statistics (for example, the maximum value of the device data DD, the minimum value of the device data DD, and the average value of the device data DD) in the interval at the step end, as the statistics data (primary statistics data), and stores the calculated statistics in the storage part 215h.

The process recipe includes step 1, step 2, step 3, step 4, and step 5. Step 3 is a specific step for executing a sub-recipe and includes n cycles, each of which includes a sub-recipe including four steps of step A, step B, step C, and step D. In FIG. 8, for the purpose of simplification of the figure, two sub-recipes, i.e., the first sub-recipe and the n-th sub-recipe, are shown, and the second to (n-1)-th sub-recipes are omitted.

Step 1 is, for example, a transferring step, step 2 is, for example, a loading step, and step 3 is, for example, a film-forming step. Step 4 is, for example, an unloading step, and step 5 is, for example, a recovering step. Step A, step B, step C, and step D of the sub-recipe may be a step of supplying a precursor gas into the process chamber 29 (step A), a first purge step of purging the precursor gas from the process chamber 29 (step B), a step of supplying a reaction gas into the process chamber 29 (step C), and a second purge step of purging the reaction gas from the process chamber 29 (step D), respectively, as described with reference to FIG. 7.

It is assumed that the current value Ip of the vacuum pump changes as illustrated in FIG. 8 from the start to the end of die process recipe. The apparatus status monitoring part 215e calculates a step execution time (sec), a maximum value, a minimum value, and an average value from the start to the end of the process recipe, as primary statistics data of the current value Ip of the vacuum pump in each of step 1, step 2, step A to step D, step 4, and step 5, and accumulates the primary statistics data in a statistics data storage area. The statistics data storage area can be set, for example, in the storage part 215h.

Here, when the process recipe transitions front step 2 to the first sub-recipe and steps A to D of the first sub-recipe are executed, step 3 of the process recipe and steps A to D of the first to n-th sub-recipes coexist. If the primary statistics data (maximum value/minimum value/average value) is accumulated in units of steps 1, 2, 3, 4, and 5 of the process recipe, the primary statistics data (the maximum value in case of pump current monitoring) of the sub-recipe cannot be known. As a workaround, only the primary statistics data of each of steps A to D of the sub-recipe is calculated and accumulated while the sub-recipe is being executed. At the time of retrieval of the primary statistics data, the accumulated data in the statistics data storage area can be retrieved and calculated as follows to calculate the statistics (maximum value/minimum value/average value) of step 3 of the process recipe.

Maximum value of step 3=Maximum value during execution of sub-recipe.

Minimum value of step 3=Minimum value during execution of sub-recipe.

Average value of step 3=(total of (sub-recipe average×step time))/step time.

Figure 9:
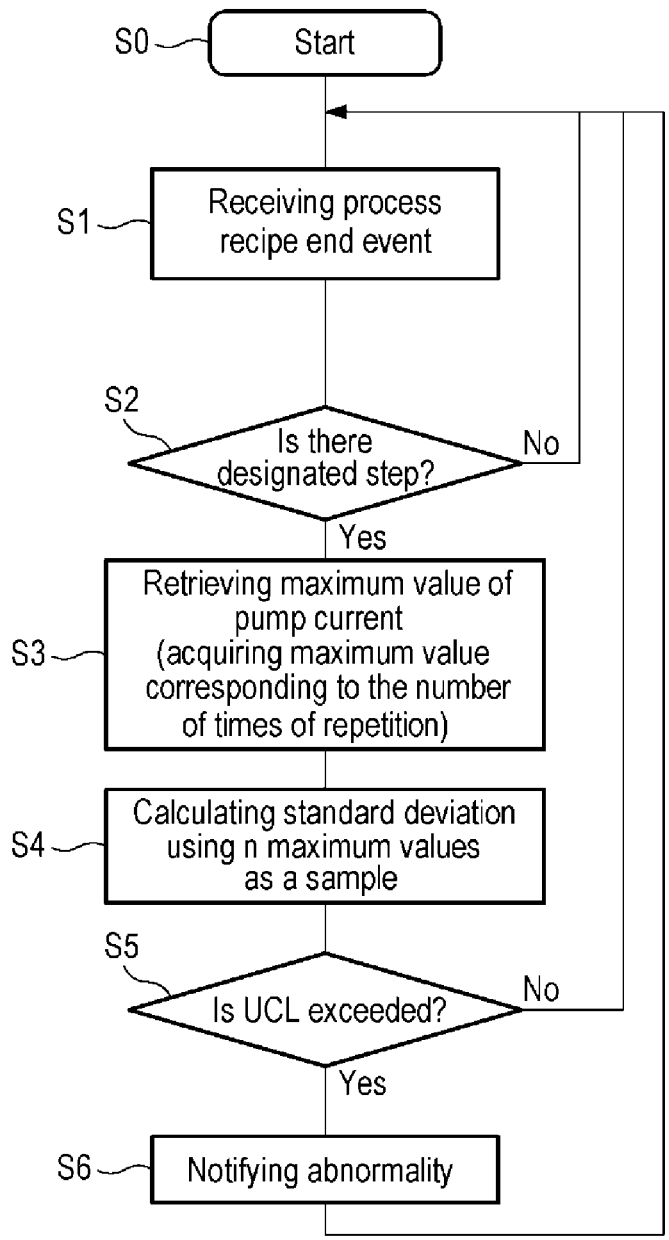
FIG. 9 is a view for explaining a flow of a pump-current-abnormality-monitoring program according to an Example.
Figures 10, 11:
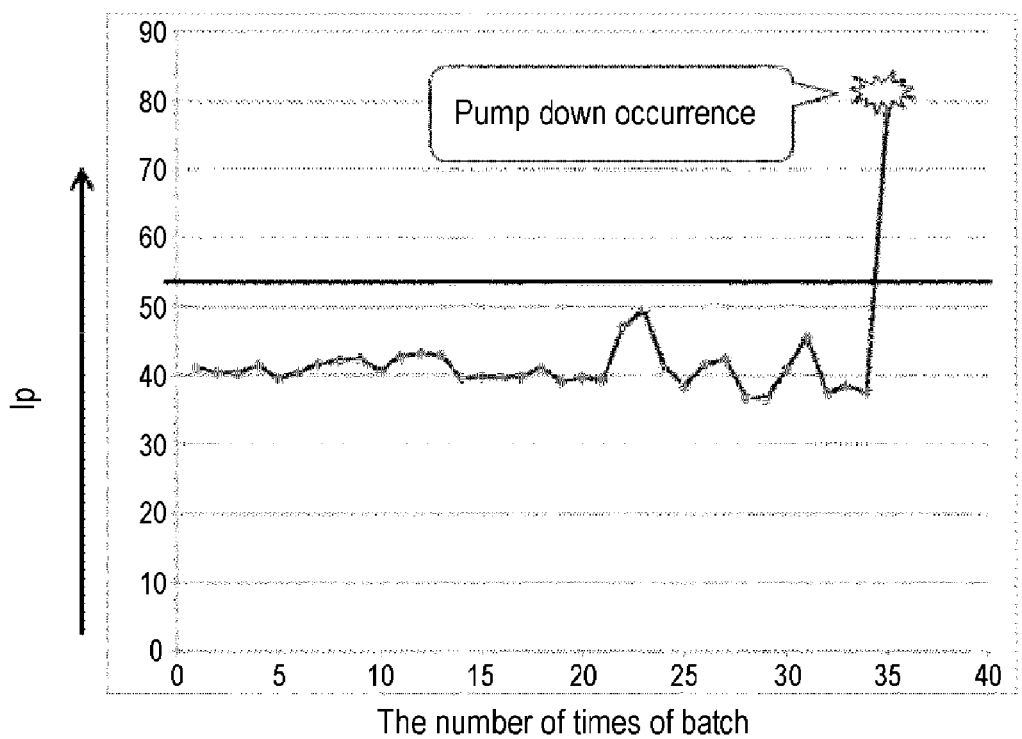
FIG. 10 is a formula for calculating a standard deviation used in the pump-current-abnormality-monitoring program according to an Example.
FIG. 11 is an explanatory view when the maximum value of a pump current is monitored according to a comparative example.

FIG. 9 is a view for explaining a flow of the pump-current-abnormality-monitoring program according to an Example. FIG. 10 is a formula for calculating the standard deviation used in the pump-current-abnormality-monitoring program according to an Example.

Next, the operation of the pump-current-abnormality-monitoring program will be described with reference to FIG. 9. The pump-current-abnormality-monitoring program is stored in the storage part 215h and is executed by the apparatus status monitoring pan 215e to operate according to the flow shown in FIG. 9.

As shown in FIG. 9, the pump-current-abnormality-monitoring program is started by executing step S0.

In step S1, when a monitoring task of the pump-current-abnormality-monitoring program receives a process recipe end event, the process proceeds to step S2.

In step S2, it is checked whether or not a designated step of a monitoring target is set in the diagnosis condition definition part 311 as monitoring contents or diagnosis condition definition data. The designated step can be, for example, one of steps A, B, C, and D of the sub-recipe. The designated step may be one or more of steps 1 to 5 of the process recipe.

When the designated step is not registered (N), the process proceeds to step S1. When the designated step is registered (Y), the process proceeds to step S3. In this Example, a case where the designated step is registered as step A will be described. The device data DD of the monitoring target is assumed to be the maximum value of the pump current Ip.

In step S3, the retrieval part 314 retrieves the statistics data storage area in which the primary statistics data are accumulated. Then, the acquisition section of the diagnosis part 315 acquires the maximum values (ymax1, ymax2, . . . , ymaxn) of the pump current in n steps A from the statistics data storage area.

In step S4, the calculation section of the diagnosis part 315 uses the n maximum values (ymax1, ymax2, . . . , ymaxn) of the pump current acquired in step S3 as a sample to calculate the standard deviation S (first standard deviation) that is secondary statistics data. The value of the standard deviation S takes a variation of n repetitions as a feature amount and can be used as an index considering the frequency of the biting load of the vacuum pump. The standard deviation S can be obtained by the formula shown in FIG. 10.

In step S5, the comparison section of the diagnosis part 315 compares the value of the standard deviation S calculated in step S4 with the upper limit value (UCL). When the value of the standard deviation S does not exceed the upper limit value (UCL) (N), the process proceeds to step S1. On the other hand, when the value of the standard deviation S exceeds the upper limit value (UCL) (Y), the process proceeds to step S6 where the apparatus status monitoring part 215e generates an alarm to notify the main controller 201 of the abnormality.

Here, calculation of the upper limit value (UCL) as a threshold value will be described. The calculation section of the diagnosis part 315 calculates the value of the standard deviation S (second standard deviation) based on the formula shown in FIG. 10. Based on the number of times of process recipe execution (corresponding to the number of data in FIG. 10) set in advance to calculate the threshold value, the acquisition section of the diagnosis part 315 acquires the standard deviation S (corresponding to the value of each data in FIG. 10) corresponding to the number of times of process recipe execution calculated until the previous process recipe is executed, like the standard deviation S calculated in step S4 during the current process recipe execution. Then, the calculation section of the diagnosis pan 315 calculates the standard deviation S (second standard deviation) by applying the acquired data to the formula of FIG. 10. The threshold value is calculated by multiplying the standard deviation S (second standard deviation) by a predetermined number. In this way, by using the standard deviation S (first standard deviation) of the device data of the designated step, it is possible to monitor tire variation of the device data until the current process recipe is executed.

When the abnormality is notified from the apparatus status monitoring part 215e to the main controller 201, the main controller 201 suppresses execution of the process recipe scheduled to be executed next, in order to transition to maintenance work such as replacement of parts of the vacuum pump and execution of a maintenance recipe of the apparatus 1. That is, the apparatus status monitoring part 215e is configured to perform control so that the main controller 201 does not execute the process recipe scheduled to be executed next. Then, maintenance of the apparatus 1 is performed. After the maintenance is completed, the main controller 201 starts the execution of the process recipe that has been suppressed but scheduled to be executed next.

The abnormality analysis support part 215f is configured to analyze the factors of the abnormal event that has occurred in the apparatus 1. If the first standard deviation S exceeds live threshold value, the comparison section of the diagnosis part 315 notifies the abnormality analysis support part 215f that the abnormality has occurred. When the abnormality (for example, pump current abnormality) has occurred, the abnormality analysis support part 215f refers to the abnormality analysis data to display a failure information screen for analyzing the factors of the abnormal event on the operation screen of the operation display part 227. Further, the abnormality analysis support part 215f is configured to display on the operation screen of the operation display part 227 the standard deviation S of the maximum value of the pump current of the designated step (step A) in the process recipe in which the abnormality has occurred and the process recipe that was executed up to the process recipe in which the abnormality has occurred.

The upper limit value (UCL) may be for example, a value that is three times (3 sigma) the standard deviation S (second standard deviation) obtained by executing the past 20 process recipes. The number of times of executions or a constant may be arbitrarily set as the upper limit value (UCL) as appropriate. The calculated upper limit value UCL is stored as monitoring contents in the storage part 215h and is used for tendency monitoring by SPC.

In this Example, the monitoring contents (diagnosis condition definition data) for monitoring the pump current abnormality is as follows.

Abnormal phenomenon: Pump foreign matter biting abnormality.

Device data: value of pump current Ip.

Designated step information of monitoring target: one of steps (step A, step B, stop C, and step D) of sub-recipe.

Statistics: standard deviation S of maximum value of each sub-recipe.

Abnormality diagnosis rule: Three times (3 sigma) the second standard deviation S is set as the upper limit value (UCL).

In FIG. 9, whether or not to calculate the standard deviation S is determined depending on whether or not the designated step is present as shown in step S2. However, the present disclosure is not limited thereto. For example, regardless of whether or not the designated step is present, the standard deviation S (first standard deviation) for the statistics (for example, the maximum value of the pump current Ip) of each of steps (step A, step B, step C, and step D) of tire sub-recipe may be calculated, and the calculated first standard deviation S of each step may be stored in the storage part 215h. Further, the statistics of each of steps (step A, step B, step C, and step D) of the sub-recipe, for example, the standard deviation S for the minimum value of the pump current Ip or the standard deviation S for the average value of the pump current Ip, may be calculated, and the calculated standard deviation S of each step may be stored in the storage part 215h.

Figure 12:
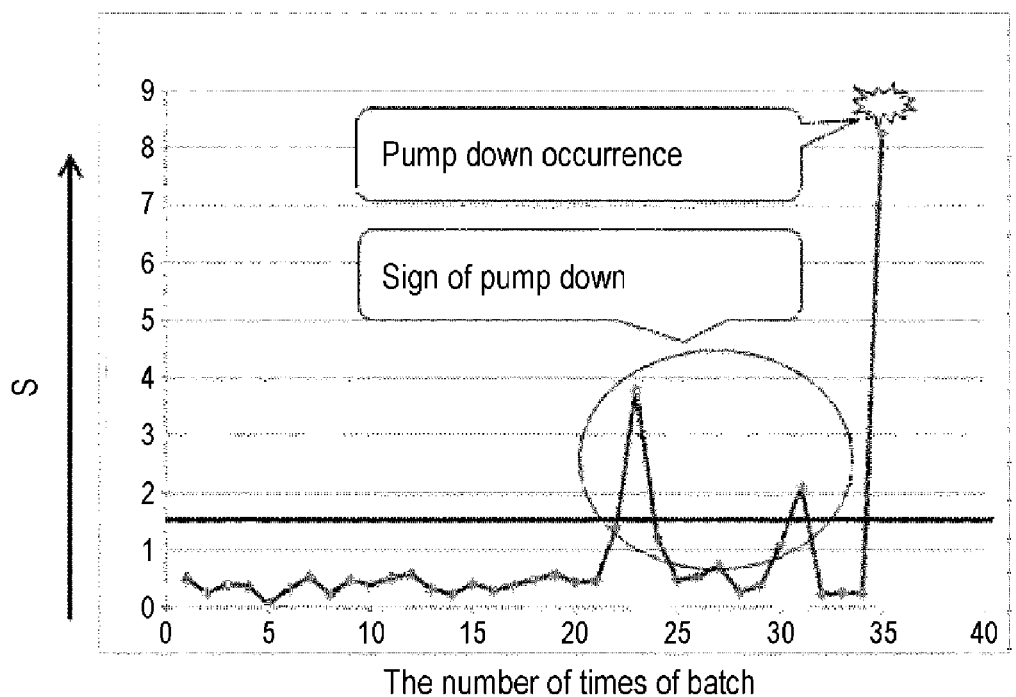
FIG. 12 is an explanatory view when the standard deviation of the maximum value of a pump current is monitored according to an Example.

FIG. 11 is an explanatory view when the maximum value of a pump current is monitored according to a comparative example. FIG. 12 is an explanatory view when the standard deviation of the maximum value of a pump current is monitored according to an Example. Although threshold values in FIGS. 11 and 12 are both indicated by a straight line (constant), this is because it is not necessary to display them accurately in explaining the present disclosure. In particular, the threshold value in FIG. 12 is calculated as a value obtained by multiplying the second standard deviation S, which is calculated from the number of times that a previous process recipe executed in the past under the same processing condition as the process recipe in which an abnormality has occurred is executed and the first standard deviation S calculated each time the previous process recipe is executed, by a constant (3 in this case).

In this Example, step A (designated step) of the sub-recipe is executed plurality times. FIG. 11 shows management of the maximum value of step A in a sub-recipe. In FIG. 11, the vertical axis represents the value of the pump current Ip, the horizontal axis represents the number of times of batch, which is the number of limes of execution of the process recipe, and a straight line indicating a threshold value represents, for example, the upper limit value of the pump current determined by the pump specifications. In this case, since the execution time of the steps in the sub-recipe is short, before the value of the pump current Ip rises to reach its peak, the process changes to tire next step (step B). Therefore, with the maximum value of the pump current Ip alone, although it may be detected that the pump has stopped, it is difficult to detect a sign of the pump stop (pump down occurrence in FIG. 11).

On the other hand, FIG. 12 shows what is managed using the standard deviation S of the maximum value of the pump current Ip at each step A of the sub-recipe. In FIG. 12, the vertical axis represents the standard deviation S of the pump current Ip, the horizontal axis represents the number of times of batch, which is the number of times of execution of the process recipe, and a straight line indicating a threshold value is three times (3 sigma) the second standard deviation S. In this case, if a spike-shaped current rises frequently, the greater the frequency of occurrence, the greater the variation in the maximum value of the pump current Ip repealed n times. In FIG. 12, the variation in the maximum value of the pump current Ip is large at two locations between 20 to 25 batches and between 30 to 32 batches. Therefore, it is possible to perform detection in consideration of the occurrence frequency, and it is possible to detect a sign of pump stop before the pump stop (pump down occurrence in FIG. 12).

The present disclosure has been described in detail based on the Examples. However, the present disclosure is not limited to the above-described embodiments and Examples, and various modifications can be made.

The semiconductor manufacturing apparatus and the semiconductor device manufacturing method have been described in the above embodiments and Examples. However, the present disclosure is not limited to the above-described semiconductor manufacturing apparatus and semiconductor device manufacturing method. For example, the present disclosure can be applied to a manufacturing apparatus and a manufacturing method of processing a glass substrate such as liquid crystal display (LCD).

In addition, the film forming process includes, for example, chemical vapor deposition (CVD), physical vapor deposition (PVD), a process for forming an oxide film or a nitride film, a process for forming a film including metal, and the like.

The semiconductor manufacturing apparatus that performs the film forming process has been described in the above embodiments and Examples. However, the present disclosure can be applied to other substrate processing apparatuses (such as an exposure apparatus, a lithography apparatus, a coating apparatus, a CVD apparatus using plasma, etc.).

According to live present disclosure, it is possible to detect a sign that a pump will stop by monitoring a change in current of the pump.

What is claimed is:

1. A substrate processing apparatus comprising:
a main controller configured to, when executing under a predetermined processing condition a process recipe including a specific step of executing a sub-recipe, control a process controller to execute the sub-recipe a plural number of times to perform a predetermined process to a substrate; and
a device management controller configured to collect device data during an execution of the process recipe and store the device data in a storage part,
wherein the device management controller is further configured to:
search the storage part;
acquire device data for a designated step among respective steps constituting the sub-recipe, which has been collected during the executing the sub-recipe for the plural number of times;
calculate a first standard deviation of the device data for the designated step acquired for the plural number of times executing the sub-recipe;
calculate a second standard deviation of a plurality of previous first standard deviations, wherein the previous first standard deviations are standard deviations of device data for the designated step that has been generated during previously executing the process recipe under the predetermined processing condition;
calculate a threshold value based on an average of the plurality of previous first standard deviations and a value obtained by multiplying the second standard deviation and a predetermined number; and
compare the first standard deviation with the threshold value and generate an alarm when the first standard deviation exceeds the threshold value, and
wherein the device management controller is configured to generate the alarm and to control the main controller not to execute a process recipe scheduled to be executed next.

2. The substrate processing apparatus of claim 1, wherein the device management controller is configured to individually calculate a standard deviation in the respective steps constituting the sub-recipe.

3. The substrate processing apparatus of claim 1, wherein the device management controller includes a calculator that calculates statistics data of the device data, and is configured to store each of the statistics data of the device data of respective steps including the specific step in the storage part during the execution of the process recipe.

4. The substrate processing apparatus of claim 1, wherein the device management controller includes a calculator that calculates statistics data of the device data, and is configured to store each of the statistics data of the device data of the designated step in the storage part during an execution of the sub-recipe.

5. The substrate processing apparatus of claim 3, wherein the calculator is configured to calculate a standard deviation value of at least one statistics data of the acquired device data.

6. The substrate processing apparatus of claim 1, wherein the sub-recipe includes at least a first step and a second step,
wherein the main controller outputs the device data to the device management controller while executing at least the first step and the second step plural times, and
wherein the device management controller is configured to store each of the device data in the first step and the second step in the storage part.

7. The substrate processing apparatus of claim 6, wherein the first step is a step of supplying a precursor gas to a process chamber,
wherein the second step is a step of supplying a reaction gas to the process chamber, and
wherein the sub-recipe further includes a third step of purging the precursor gas or a fourth step of purging the reaction gas.

8. The substrate processing apparatus of claim 1, wherein the device management controller is configured to further include:
    an acquisition part that acquires statistics data of the device data for a number of times that the designated step is executed; and
    a comparator that compares the first standard deviation with the threshold value.

9. The substrate processing apparatus of claim 8, further comprising an abnormality analysis support part configured to support analysis of an abnormality that has occurred in the substrate processing apparatus,
    wherein the comparator notifies the abnormality analysis support part of the abnormality if the first standard deviation exceeds the threshold value, and
    wherein the abnormality analysis support part is configured to display a failure information screen for analyzing a factor of the abnormality on an operation screen.

10. The substrate processing apparatus of claim 9, wherein the abnormality analysis support part is configured to display, on the operation screen:
    the first standard deviation in a process recipe in which the abnormality has occurred; and
    the first standard deviation in a process recipe that has been executed up to the process recipe in which the abnormality has occurred.

11. A method of monitoring an abnormality of a substrate processing apparatus including an operator configured to, when executing under a predetermined processing condition a process recipe including a specific step of executing a sub-recipe, control a process controller to execute the sub-recipe a plural number of times to perform a predetermined process to a substrate, and a data monitor configured to collect device data during an execution of the process recipe and store the device data in a storage part, the method comprising:
    searching the storage part;
    acquiring device data for a designated step among respective steps constituting the sub-recipe, which has been collected during the executing the sub-recipe for the plural number of times;
    calculating a first standard deviation of the device data for the designated step acquired for the plural number of times executing the sub-recipe;
    calculating a second standard deviation of a plurality of previous first standard deviations, wherein the previous first standard deviations are standard deviations of device data for the designated step that has been generated during previously executing the process recipe under the predetermined processing condition;
    calculating a threshold value based on an average of the plurality of previous first standard deviations and a value obtained by multiplying the second standard deviation and a predetermined number; and
    comparing the first standard deviation with the threshold value; and
    generating an alarm when the first standard deviation exceeds the threshold value, and
    wherein the device management controller is configured to generate the alarm and to control the main controller not to execute a process recipe scheduled to be executed next.

12. A non-transitory computer-readable recording medium storing a program of a substrate processing apparatus that is executed in a computer for controlling the substrate processing apparatus including:
    a main controller configured to, when executing under a predetermined processing condition a process recipe including a specific step of executing a sub-recipe, control a process controller to execute the sub-recipe a plural number of times to perform a predetermined process to a substrate; and
    a device management controller configured to collect device data during an execution of the process recipe and store the device data in a storage part,
    the program causing the computer to execute a process comprising:
    searching the storage part in which the device data is stored;
    acquiring device data for a designated step among respective steps constituting the sub-recipe, which has been collected during the executing the sub-recipe for the plural number of times;
    calculating a first standard deviation of the device data acquired for the plural number of times executing the sub-recipe;
    calculating a second standard deviation of a plurality of previous first standard deviations, wherein the previous first standard deviations are standard deviations of device data for the designated step that has been generated during previously executing the process recipe under the predetermined processing condition;
    calculating a threshold value based on an average of the plurality of previous first standard deviations and a value obtained by multiplying the second standard deviation and a predetermined number; and
    comparing the first standard deviation with the threshold value and generating an alarm when the first standard deviation exceeds the threshold value, and
    wherein the device management controller is configured to generate the alarm and to control the main controller not to execute a process recipe scheduled to be executed next.

* * * * *